United States Patent
Edelstein

(10) Patent No.: US 7,046,002 B1
(45) Date of Patent: May 16, 2006

(54) MAGNETIC SENSOR WITH VARIABLE SENSITIVITY

(75) Inventor: Alan S. Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/997,031

(22) Filed: Nov. 26, 2004

(51) Int. Cl.
*G01R 33/02* (2006.01)
*G01R 33/025* (2006.01)
*G01R 33/06* (2006.01)

(52) U.S. Cl. ............ 324/244; 324/225; 324/251; 324/252; 324/259

(58) Field of Classification Search ........... 324/244, 324/225, 252, 259, 251
See application file for complete search history.

(56) References Cited

U.S. PATENT DOCUMENTS

| | | |
|---|---|---|
| 4,322,709 A | 3/1982 | Vonder et al. |
| 4,587,509 A | 5/1986 | Pitt et al. |
| 5,180,970 A | 1/1993 | Ross |
| 5,406,202 A | 4/1995 | Mehrgardt et al. |
| 5,942,895 A | 8/1999 | Popovic et al. |
| 5,998,995 A * | 12/1999 | Osiander et al. ............ 324/259 |
| 6,175,229 B1 | 1/2001 | Becker et al. |
| 6,275,034 B1 | 8/2001 | Tran et al. |
| 6,420,868 B1 * | 7/2002 | Ganther et al. ............ 324/248 |
| 6,501,268 B1 | 12/2002 | Edelstein et al. |
| 6,570,373 B1 | 5/2003 | Viola |
| 6,580,269 B1 | 6/2003 | Hiligsmann et al. |
| 6,848,317 B1 * | 2/2005 | Kim ......................... 73/714 |
| 2003/0094942 A1 | 5/2003 | Friend et al. |

* cited by examiner

*Primary Examiner*—Bot Ledynh
*Assistant Examiner*—Reena Aurora
(74) *Attorney, Agent, or Firm*—Edward L. Stolarun

(57) ABSTRACT

A microelectromechanical system (MEMS) device comprising a base structure; a magnetic sensor attached to the base structure and operable for sensing a magnetic field and allowing for a continuous variation of an amplification of the magnetic field at a position at the magnetic sensor; and for receiving a DC voltage and an AC modulation voltage in the MEMS device; a pair of flux concentrators attached to the magnetic sensor; and a pair of electrostatic comb drives, each coupled to a respective flux concentrator such that when the pair of electrostatic comb drives are excited by a modulating electrical signal, each flux concentrator oscillates linearly at a prescribed frequency; and a pair of bias members (mechanical spring connectors) connecting the flux concentrators to one another.

22 Claims, 9 Drawing Sheets

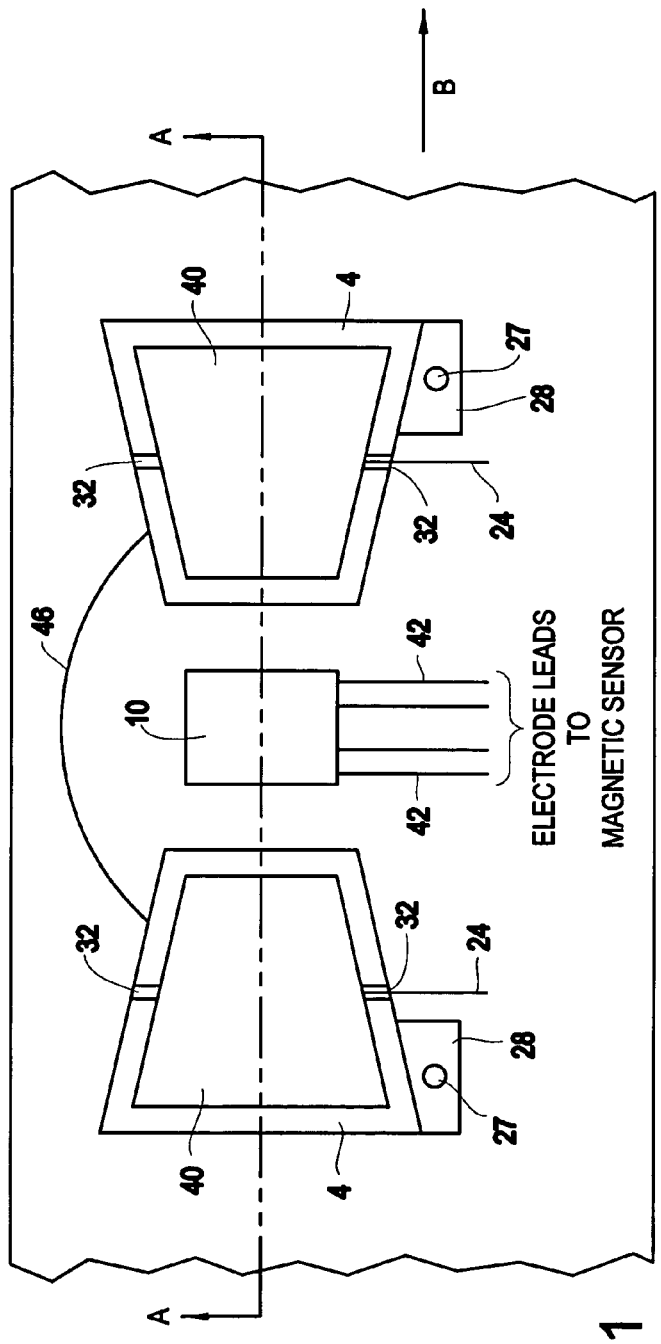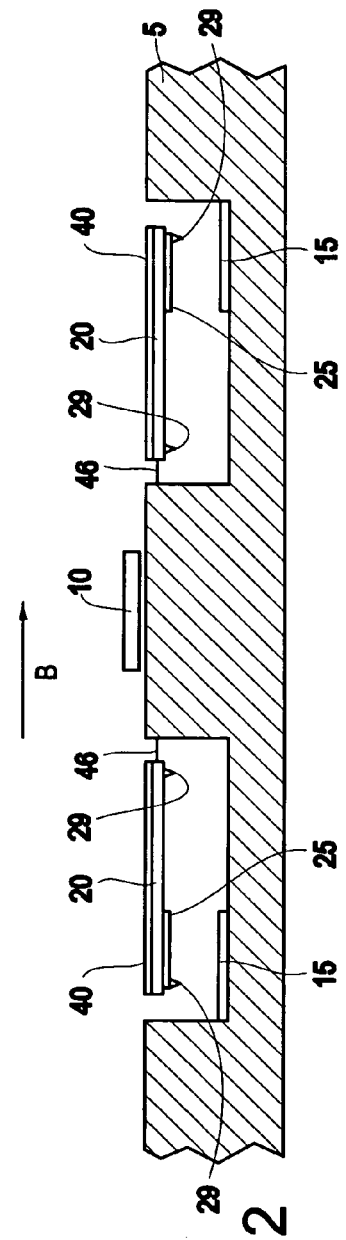
FIG.1
FIG.2

MAGNETIC SENSOR WITH VARIABLE SENSITIVITY

GOVERNMENT INTEREST

The invention described herein may be manufactured, used, and/or licensed by or for the United States Government.

BACKGROUND OF THE INVENTION

1. Field of the Invention

The invention generally relates to magnetic transducers, and more particularly to magnetic sensors used with microelectromechanical system (MEMS)-type components.

2. Description of the Related Art

Conventionally, most magnetic sensors used to measure electrical current flow have a limited dynamic range. If they are very sensitive, they will saturate and become inoperative in larger magnetic fields. As such, there is a need to increase this dynamic range. The measurement of electrical currents may be affected by 1/f noise and by signals from other sources. For example, it is difficult to measure small 60 Hz currents because of the presence of 60 Hz background noise. Thus, there is a need to mitigate the effect of 1/f noise and other sources of magnetic fields.

Interest is increasing in the development of miniature sensors for sensing magnetic fields in extraterrestrial, industrial, biomedical, oceanographic, and environmental applications. The trend in magnetic sensor design and development is constantly toward smaller size, lower power consumption, and lower cost for similar or improved performance.

There are several types of magnetometers, which are magnetic sensors with external instrumentation, currently used. The least expensive and least sensitive devices have a resolution of approximately $10^{-1}$ Oersted (Oe)/Hz$^{1/2}$ and typically are Hall effect devices. These devices operate by sensing a voltage change across a conductor or semiconductor placed in a magnetic field. Such devices do not lend themselves for applications requiring greater sensitivity, such as required in brain scan devices and magnetic anomaly detection devices.

Flux gate magnetometers are more sensitive, having a resolution of approximately $10^{-6}$ Oe/Hz$^{1/2}$. Flux gate magnetometers use a magnetic core surrounded by an electromagnetic coil, and are difficult to microfabricate. Additionally, flux gate magnetometers require a relatively large amount of power and accordingly do not lend themselves to a low-cost, compact, portable design.

The most sensitive magnetometers called SQUIDS (superconducting quantum interference detectors) have a resolution of approximately $10^{-10}$ Oe/Hz$^{1/2}$. However, because SQUIDS include a superconducting element, these apparatus must include cooling means at liquid gas temperatures, making them extremely bulky and expensive to operate. Also, their relatively large size limits their utility because the active superconducting element cannot be placed directly adjacent to the source of the magnetic field. As such, it is common in magnetic sensors to place the sense element between two stationary flux concentrators to enhance the field.

Accordingly, there is a need for small, inexpensive, low power magnetometers, which have an even greater sensitivity than the conventional devices, and which are useful for a variety of magnetometer applications at low frequencies. Magnetoresistive sensors are suited for low-cost, medium-sensitivity applications. For example, using spin-dependent tunneling magnetoresistive sensors, one can observe 38% changes in the resistivity in fields of a few Oe. See, e.g., D. Song, J. Nowak & M. Covington, *J. Appl. Phys*, 87, 5197 (2000), the complete disclosure of which is herein incorporated by reference.

Furthermore, magnetic sensors used to detect objects that move slowly typically possess considerably low frequency 1/f-type noise, which is an unwanted condition. Generally, there is a tendency for such devices, which have higher sensitivity, to also exhibit higher 1/f-type noise. This type of noise generally occurs when using magnetoresistive-type magnetic sensors. See, e.g., van de Veerdonk et al. *J. Appl. Phys*. 82, 6152 (1997), the complete disclosure of which is herein incorporated by reference.

Another problem with many magnetic sensors is that the change in signal due to the magnetic field is small compared with the background signal that will be referred to as the DC offset. For example, in spin valve giant magnetoresistor sensors, the change is about 5–10%. For anisotropic magnetoresistance sensors the change is even smaller. Extracting the signal from the DC offset requires using carefully constructed bridges and other techniques.

A well known way of increasing the sensed magnetic field by a magnetic sensor is by use of a flux concentrator, which can enhance a sensed magnetic field by as much as a factor of 50. See e.g., N. Smith et al., *IEEE Trans. Magn.* 33, p. 3358 (1997), the complete disclosure of which is herein incorporated by reference. An example of such a device is taught in Popovic et al., U.S. Pat. No. 5,942,895, issued Aug. 24, 1999, entitled "Magnetic field sensor and current and/or energy sensor," the complete disclosure of which is herein incorporated by reference, which teaches the use of Hall effect sensors with flux concentrator components.

A magnetic sensor (magnetometer) which addresses 1/f-type noise is taught in Hoenig, U.S. Pat. No. 4,864,237, issued Sep. 5, 1989, the complete disclosure of which is herein incorporated by reference. Hoenig teaches an apparatus for measuring magnetic fields, which change only at extremely low frequency. Hoenig uses a SQUID magnetometer, which includes a superconducting flux transformer that inductively couples a detected signal into a DC SQUID sensor.

The magnetometer of Hoenig may include a device for modulating the detected signal in a frequency range characteristic of low-noise operation of the SQUID. The modulation frequencies are generally above 1 Hz and optionally even above 1 Khz. However, the limitations of this device, and others like it, include the need for a cryogenic operation, which inherently does not lend to relatively low cost, low power use.

In U.S. Pat. No. 6,501,268 issued to Edelstein et al. on Dec. 31, 2002, the complete disclosure of which is herein incorporated by reference, it is indicated that MEMS flux concentrators use torsional motion of MEMS flaps around torsional suspensions driven by the electrostatic field applied between two parallel capacitance plates.

The above-referenced techniques were satisfactory for the purposes for which they were intended. However, there continues to remain a need for small, low-cost, low-power-consuming magnetic sensors having enhanced sensitivities capable of meeting the varied applications listed above for detecting low frequency signals and minimizing 1/f-type noise. Also, there remains a need for an improved MEMS device with a greater dynamic range of motion to allow for larger modulation of an electrical signal.

SUMMARY OF INVENTION

In view of the foregoing, an embodiment of the invention provides a microelectromechanical system (MEMS) device comprising a base structure; a magnetic sensor attached to the base structure and operable for sensing a magnetic field and allowing for a continuous variation of an amplification of the magnetic field at a position at the magnetic sensor; and for receiving a DC voltage and an AC modulation voltage in the MEMS device; a pair of flux concentrators attached to the magnetic sensor; and a pair of electrostatic comb drives, each coupled to a respective flux concentrator such that a first half of each comb drive is attached to the base structure opposite from a corresponding second half of each comb drive that is attached to the flux concentrator such that when the pair of electrostatic comb drives are excited by a modulating electrical signal, each flux concentrator oscillates linearly or in a rotational motion at a prescribed frequency; and a pair of bias members (mechanical spring connectors) connecting the flux concentrators to one another; wherein the DC voltage increases a spacing between the flux concentrators; and wherein the flux concentrators are modulated to increase an operating frequency to eliminate 1/f-type noise, where f is a frequency of operation of the magnetic sensor.

Moreover, according to the invention the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor. Also, the AC modulation voltage shifts the operating frequency of the magnetic sensor. Additionally, each flux concentrator may comprise a layer of a hard magnetic material, a spacer layer, and a layer of a soft magnetic material, wherein the layer of soft magnetic material comprises single domain magnetic particles and a nonmagnetic material, wherein a coercivity of the hard magnetic material is greater than approximately 50 Oersteds and a coercivity of the soft magnetic material is less than approximately 3 Oersteds, and wherein a volume fraction of single domain magnetic particles to nonmagnetic material is less than or equal to approximately fifty percent.

In another embodiment, the invention provides a low-frequency microelectromechanical modulating magnetic field transducer comprising a base structure; a magnetic sensor attached to the base structure and operable for receiving a DC voltage and an AC modulation voltage in the MEMS device; a flap on either side of the magnetic sensor, each flap including a flux concentrator; a pair of electrostatic comb drives, each coupled to a respective flux concentrator such that a first half of each comb drive is attached to the base structure opposite from a corresponding second half of each comb drive that is attached to the flux concentrator such that when the pair of electrostatic comb drives are excited by a modulating electrical signal, each flux concentrator oscillates linearly at a prescribed frequency thereby minimizing 1/f-type noise, where f is a frequency of operation of the magnetic sensor; at least one mechanical spring connector connecting the flaps to one another; wherein the DC voltage increases a spacing between the flux concentrators, wherein the flux concentrators are modulated to increase an operating frequency to eliminate 1/f-type noise, and wherein the AC modulation voltage increases the operating frequency of the magnetic sensor. Another advantage of the invention is that since the signal is modulated, the problem of the DC offset, described above, can be simply eliminated by passing the signal through a high pass filter or amplifier.

These, and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

The invention will be better understood from the following detailed description of the preferred embodiments of the invention with reference to the drawings, in which:

FIG. 1 is a plan view of a flux concentrator in combination with a magnetic sensor using MEMS fabrication according to the invention;

FIG. 2 is a cross-section view along line A—A of FIG. 1 according to the invention;

DETAILED DESCRIPTION OF PREFERRED EMBODIMENTS OF THE INVENTION

Figure 3A:
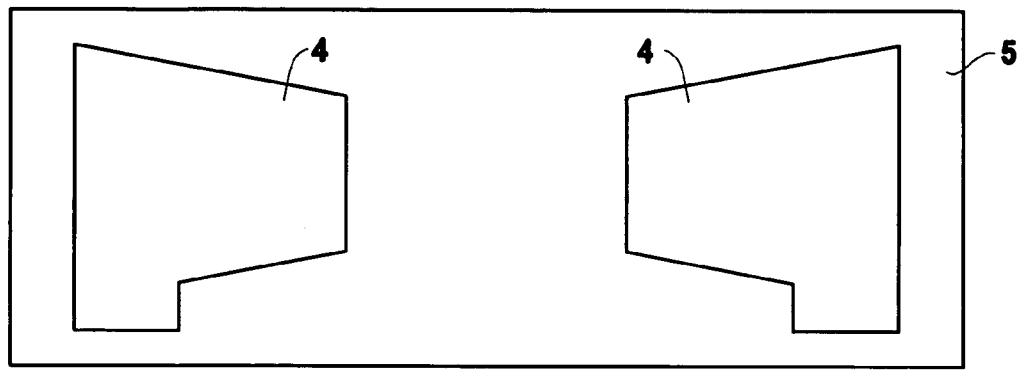
FIGS. 3a, 3b, 3c, 3d, 3e, 3f, and 3g illustrate the preferred processing steps involved in manufacturing the invention.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for small, low-cost, low-power-consuming magnetic sensors having enhanced sensitivities capable of meeting the varied applications listed above for detecting low frequency signals and minimizing 1/f-type noise. Also, there remains a need for an improved MEMS flux concentrator with a greater dynamic range of motion to allow for larger modulation and more space for the magnetic sensor. While, the conventional designs were designed for operating in the kHz range of frequencies, the invention operates at DC. DC operation has several benefits. First, by applying a DC voltage the average separation between the MEMS flaps can be decreased. This increases the sensitivity of the sensor. If the signal is so large that the sensor saturates, the DC voltage can be decreased. Second, DC operation permits one to compare the noise with and without the modulation. Third, one can study how the signal strength varies as one applies a voltage to vary the distance between the plate. Fourth, if for some reason one cannot drive the motion of the flux concentrators, the sensor can still operate but at decreased performance levels. Referring now to the drawings, and more particularly to FIGS. 1 through 11, there are shown preferred embodiments of the invention.

Referring to FIGS. 1 and 2, an exemplary form of the device using the concepts of the invention is illustrated which includes a magnetic sensor 10 with two flux concentrators 40 which may oscillate about an axis 24 (conducting torsional suspension member 32). Each flux concentrator 40 increases the sensed magnetic flux density at the position of magnetic sensor 10 when the flux concentrators are in the horizontal position, i.e., the plane of the substrate. A layered material forming part of flux concentrator 40 can comprise a thick film of a soft ferromagnetic material with a large magnetic permeability.

In a preferred form, magnetic sensor 10 comprises films deposited on silicon substrate 5. Flux concentrators 40 are deposited on silicon flaps 20. Modulation of a sensed magnetic signal at magnetic sensor 10 is accomplished by using torsionally suspended flux concentrator members 40 which oscillate about torsional suspension members 32 or performs oscillatory rotation about an axis 24. Silicon flaps 20 and torsional suspension members 32 may be formed using microelectromechanical system (MEMS) fabrication techniques.

In the magnetometer, flux concentrators 40 on silicon flaps 20 are driven electrostatically to oscillate at modulating frequency $f_m$ about torsional suspension members 32, which stably retains flux concentrators 40 above recesses 4 and allows them to oscillate. When flux concentrators 40 are in a middle (flat) position (as illustrated in FIG. 2), the sensed magnetic flux is concentrated at magnetic sensor 10.

In operation, when flux concentrators 40 are rotated to the up and down positions (the edges closest to the sensor 10 are raised above and then lowered below the top surface of substrate 5), the concentrated magnetic field is deflected away from magnetic sensor 10. In these positions, there is minimal enhancement of the flux field sensed by the magnetic sensor. Mechanical connectors 46 (which may be embodied as bias members such as springs) are shown connecting the flux concentrators 40 to one another.

FIG. 2 is a cross-section along line A—A of FIG. 1. FIG. 2 illustrates magnetic field magnetic sensor 10, which preferably uses a Hall-effect device, magnetoresistive or magnetorestrictive type magnetic sensor. Two magnetic flux concentrators 40 are provided to strengthen the magnetic field at the position of magnetic sensor 10 in direction B. Accordingly, the concentrated magnetic field is greatest when flux concentrators 40 are substantially aligned with magnetic sensor 10 as illustrated in FIGS. 1 and 2.

The dimensions of flux concentrators 40 in FIG. 1 typically encompass gross dimensions of approximately 100 by 75 microns, while the thickness of the concentrators is typically approximately 0.1 to 15 micrometers. Electrode pads 15 may be deposited in recesses 4 of substrate 5. Other matching electrode pads 25 may be deposited on the underside of silicon flaps 20. Electrical connections to electrode pads 25 on the bottom of silicon flaps 20 may be made by coating torsional suspension members 32 with a conductor 24. The electrical connection to bottom electrode pads 15 may be made by a via 27.

The torsional or pivotal oscillating motion of silicon flaps 20 about torsional suspension members 32 or the axis of rotation is driven electrostatically at a frequency, $f_m$, by applying an AC voltage from a signal generator (not shown) between bottom electrode pads 15 and top electrode pads 25. Top electrode pads 25 are formed on both silicon flaps 20 while bottom electrode pads 15 are formed in each of recesses 4 of substrate 5.

Driving the motion from the signal generator requires very little power, particularly if the drive frequency is set equal to the mechanical resonant frequency of silicon flaps 20 containing flux concentrators 40. By using the resonant frequency, one obtains the largest amplitudes for the oscillations using the least power. The magnetic field generated by the small currents of the exciting electrostatic modulating signal is negligible.

Magnetic sensor 10 may comprise a Hall-effect device wherein four leads are required. Other types of Hall effect devices, which typically have a rectangular geometry with current or voltage electrodes arranged on each side of a rectangle, may also be used. It is also possible to use Hall devices in which three or all four electrodes are arranged on one side of the rectangle. See, e.g., Falk et al., U.S. Pat. No. 5,057,890, issued Oct. 15, 1991, the complete disclosure of which is herein incorporated by reference.

When a Hall effect device is used, an output voltage from such a device results from the Lorentz force of the magnetic field acting on charge carriers within such a device. Other types of magnetic sensors which may be used other than Hall effect devices include flux gate magnetometers and magnetoresistive sensors which include anisotropic magnetoresistive sensors, giant magnetoresistive sensors, spin dependent tunneling sensors, bismuth sensors, magnetostrictive sensors, and MEMS sensors, and the like.

When magnetic sensor 10 is a magnetoresistive element, a Wheatstone electrical bridge configuration may be used to interface with the magnetic sensor. When the resistance of the magnetoresistive element changes because of a magnetic field, the bridge output voltage changes. Using the flux concentrator increases the change in the bridge output. The bridge output voltage is modulated at a frequency $2f_m$, typically the resonant frequency of the suspended silicon flaps 20, by the motion of the MEMS flux concentrators 40. The signal may then be amplified by a narrow band amplifier and then demodulated. The bandwidth of the amplifier only has to be broad enough to include the low frequencies in the original signal coming into the MEMS flux concentrator. Displacements of the MEMS flux concentrators in the plane or rotations of the edges of the flux concentrators closest to the sensor about the axis of rotation should preferably be approximately 5 to 25 microns. These motions are required to modulate the field. Moreover, the invention provides larger displacements at lower frequencies. The range of frequencies should preferably be approximately 1 to 50 kHz.

The invention is used to allow a variation of the amplification of the magnetic field at the position of the sensor 10. Thus, if the field would saturate the sensor 10, the amplification can be decreased. It is not important to vary the amplification continuously, but it is desirable to be able to change the sensitivity in steps. Thus, one could avoid having the signal be too small to detect with a reasonable signal to noise ratio or so large that it saturates the device.

As mentioned, the invention achieves large rotations/ displacements by applying a DC voltage to the device, the spacing between the flux concentrators 40 and the sensor increases thereby decreasing the enhancement. By doing so, the change in sensitivity of the sensor to an external field may be varied by as much a factor of 20. The sensitivity can be calibrated using a known magnetic field that can be part of the sensor 10. It is important to control the sensitivity so that the signal noise ratio is good or that the sensor is not saturated.

The invention allows for a variable gain to increase the dynamic range by applying a DC voltage. In addition, one can apply an AC modulation voltage at a frequency $f_m$, which will modulate the signal seen by the sensor at $2f_m$. This has the effect of shifting the operating frequency to higher frequencies where the 1/f noise is smaller. The following illustrates an example of the use of the device provided by the invention. One would first apply an AC voltage at the normal mode resonant frequency for the two MEMS flaps to move 180° out of phase with one another. The amplitude would be kept below the level where there is arcing or anything touches it. One then would examine the resulting AC signal from the sensors at twice the drive frequency to see if there was a good signal to noise ratio or if the signal saturated the system. If the signal to noise ratio was too small, one could increase the AC voltage or apply a DC voltage. If a DC voltage was already applied and the observed signal saturated the system, one could decrease the magnitude of the DC voltage.

Figure 4:
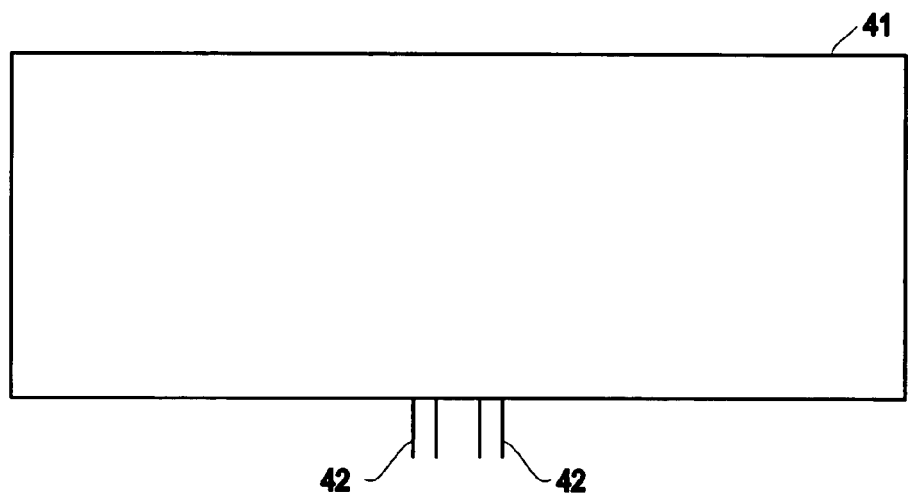
FIG. 4 illustrates a container for use with the device of FIGS. 1 and 2 according to the invention.

FIG. 4 is plan view of a container 41 for the device of FIGS. 1 and 2. Container 41 may comprise a vacuum package containing the device of FIG. 1 therein. Electrical leads 42 for magnetic sensor 10 and leads for upper and lower electrode pads 25, 15 (not shown for simplicity) pass through airtight seals in container 41. Methods for vacuum packaging are known in the art.

Figure 5:
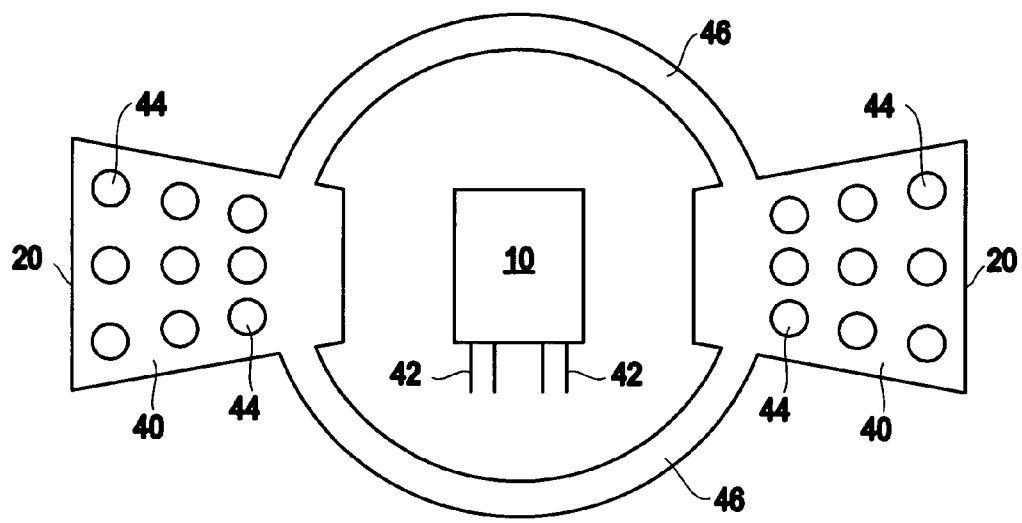
FIG. 5 is an alternate view of the device according to the invention.

FIG. 5 is a plan view of silicon flaps 20, flux concentrators 40, and magnetic sensor 10 of FIGS. 1 and 2. Silicon flaps 20 and flux concentrators 40 include at least one hole 44 formed therein for decreasing air resistance and, therefore, energy loss, when silicon flaps 20 move. Preferably, a plurality of holes 44 is included in the flux concentrators 40.

FIG. 5 also illustrates the mechanical connectors 46 between silicon flaps 20. The mechanical connectors 46 between silicon flaps 20 preferably should not contain any magnetic permeable material. In a preferred embodiment, the mechanical connectors 46 illustrated in FIG. 5 are semi-circular in shape. However, other shapes and configurations for mechanical connectors 46 are possible within the spirit and scope of the invention.

Mechanical connectors 46 couple MEMS silicon flaps 20. This coupling has two advantages. First, the coupling makes a fundamental change in the how the MEMS flaps will tend to move. Instead of moving independently of one another, their motion in now coupled. The motion is best analyzed in terms of normal modes. At the normal mode frequencies the amplitude of the motion is larger and there is a fixed phase relationship between the motions of the two flaps. More specifically, for the system shown in FIG. 5, there are normal mode resonant frequencies such that the two MEMS flaps will always move in phase with one another or 180° out of phase with one anther. This will ensure that the magnetic sensor 10 is always exposed to a simple periodic field. In the in phase motion the silicon flaps 20 go up and down together. Second, as the flaps go up and down, mechanical connectors 46 tend to limit the extent of the motion of silicon flaps 20 so that bottom electrode pads 15 and top electrode pads 25 do not come in contact with one another and become shorted. More serpentine coupling paths may also be used.

As discussed previously, it is important to minimize the 1/f noise of the flux concentrator 40. Silicon flaps 20 in FIG. 1 are coated with a soft magnetic material. The 1/f noise is minimized if the magnetization changes by domain rotation. The magnetization may be forced to change by domain rotation by coating the magnetic material onto the flaps in a special way as shown in FIG. 6.

Figure 6:
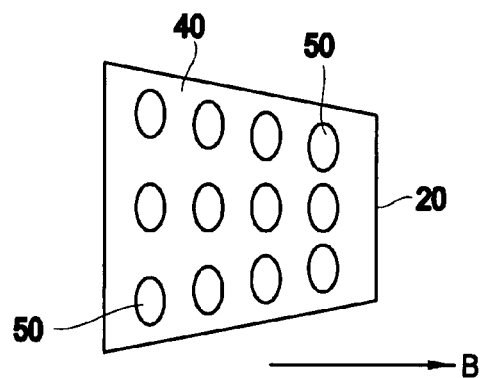
FIG. 6 is a plan view of one of the silicon flaps of FIG. 5 according to the invention.
Figure 7:
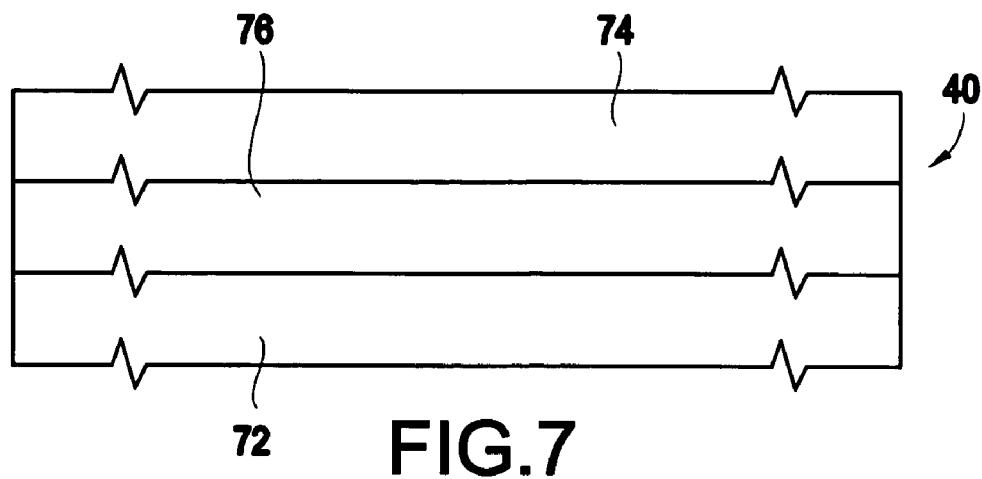
FIG. 7 is a cross-section view of one embodiment of a flux concentrator according to the invention.

FIG. 6 is a plan view of one flap 20. The soft magnetic material may be deposited in the form of ellipses 50 using lithography or a phase separation method. If ellipses 50 are suitably small they will be single domains. Suitably small means less than several microns in size or, for some materials, as little as 50 nm. Thus, there are no domain walls.

When ellipses 50 are single domain, the magnetization can only change by domain rotation. Having the major axis of each ellipse 50 perpendicular to the field direction B makes that direction the easy axis, i.e., in a zero field the magnetization will be in the plane of the flap 20 and perpendicular to the B direction. This is the preferred direction for making a magnetic sensor, which has a linear response. How much lower the energy will be in the easy axis direction may be controlled by varying the ratio of the length of the major to minor axis.

It will be understood that various combinations of the vacuum container, holes in the flaps, single domain magnetic material and the mechanical connection between the flaps may be used to maximize the performance of the invention.

In its simplest form the flux concentrator may comprise a single layer of a soft ferromagnetic material (e.g., Permalloy or the like). There are several other alternatives. One is to replace the single layer with many small ellipses in the same plane as the original single layer and with their major axes perpendicular to the sense direction of the magnetic field. The ellipses should be so small that they each comprise a single domain or only a small number of domains.

By using these ellipses, the magnetization will change primarily by domain rotation. Domain rotation is a lower noise process than domain wall motion. The easy axes of the ellipses will be along their major axes. By having the major axes perpendicular to the field measuring direction, the magnetization will tend to be perpendicular to the field measuring direction. The application of a magnetic field in the field measuring direction will tend to rotate the magnetizations of each ellipse in that direction.

Alternatively, flux concentrators 40 may be constructed in multiple layers. In one embodiment illustrated in FIG. 7, these layers may comprise a hard magnetic material (having a coercivity greater than 50 Oersteds) layer 72 and a soft magnetic material (having a coercivity less than 5 Oersteds) layer 74 with equal magnitude magnetizations separated by a spacer layer 76. Spacer layer 76 may comprise a nonmagnetic material, such as aluminum or silicon dioxide.

The thicknesses of layers 72, 74 and 76 may be, for example, approximately one micron. In a zero applied field, the magnetizations of both the hard material and the soft material should preferably be perpendicular to the field measuring direction B and directed opposite to one another. Thus, in the absence of an applied field, the fields due to the soft and hard material should approximately cancel one another at the position of the sensor.

Figure 8:
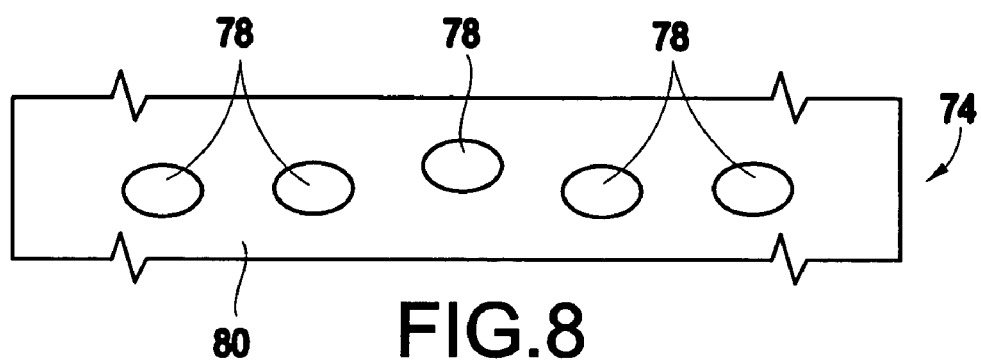
FIG. 8 is a cross-section view of one layer of the flux concentrator of FIG. 7 according to the invention.

As illustrated in FIG. 8, layer 74 of the soft magnetic material may comprise a composite of single domain magnetic particles 78 and a nonmagnetic material 80. By restricting magnetic materials to be composed of single domain particles 78, the magnetization within such materials can only change by domain rotation and not domain wall motion. Particles of a soft ferromagnetic material (such as Permalloy nickel which is approximately 80 atomic percent iron and 20 atomic percent permalloy, or Permalloy) which are roughly larger than 10 nm and smaller than approximately 50 nm will be single domain and not superparamagnetic.

The volume fraction of single domain magnetic particles 78 to the nonmagnetic material may be up to approximately 50%. Domain rotation generates much less noise compared to domain wall motion. Moreover, it is still desirable that the magnetizations of the soft magnetic material and the hard magnetic material cancel in the absence of an external field.

A design may be used wherein the edges of flux concentrators 40 are modified to decrease the magnetic noise by treating the edges of the soft magnetic material of flux concentrators 40 so that they have slightly higher coercivity than the center. This improves the magnetic response. The rest of the flux concentrator preferably includes a similar three-layer structure with similar arrangement of the magnetizations as described above. The directions of the magnetization may be obtained by processing the flux concentrator in a magnetic field. Such an overall geometry maximizes the response of the flux concentrator to a field that is applied in the field measuring direction B.

The invention is preferably fabricated by MEMS processing techniques. Such techniques are addressed by LIGA (Lithographie, Galvanoformung, Abformung, for "lithography, electroplating, molding") micromachining processing methods that use metals, polymers and even ceramics for the production of varied microstructured devices having extreme precision. These collective microstructures are referred to as MEMS-type devices, which are alternatives to conventional discrete electromechanical devices such as relays, actuators, and sensors. When properly designed, MEMS-type devices produce useful forces and displacement, while consuming reasonable amounts of power.

Current LIGA processes create features whose top surface is as much as 200-microns above the substrate. Any technology may be used to form the device, whether a LIGA-type process or a bulk plasma micromachining technique such as RIE (reactive ion etching), or a surface micromachining technique using standard photolithography and etching processes yielding the desired configurations. Preferably, each flux concentrator 40 is fabricated on a die which in an extreme case might be as large as one square centimeter, but is more likely to be less than on square millimeter in area and approximately 0.5 to 50 microns thick.

As mentioned above, preferably, each device is implemented on a single silicon chip or die, but multiple dies may also be used. In a preferred embodiment of the invention, the device is monolithic in its basic configuration. MEMS devices may be readily integrated and interfaced with electronics because they are fabricated much the same way as integrated circuits. The specific MEMS fabrication technique requires only desired geometries and mechanical and electrical performance characteristics are obtained.

Figure 3B:
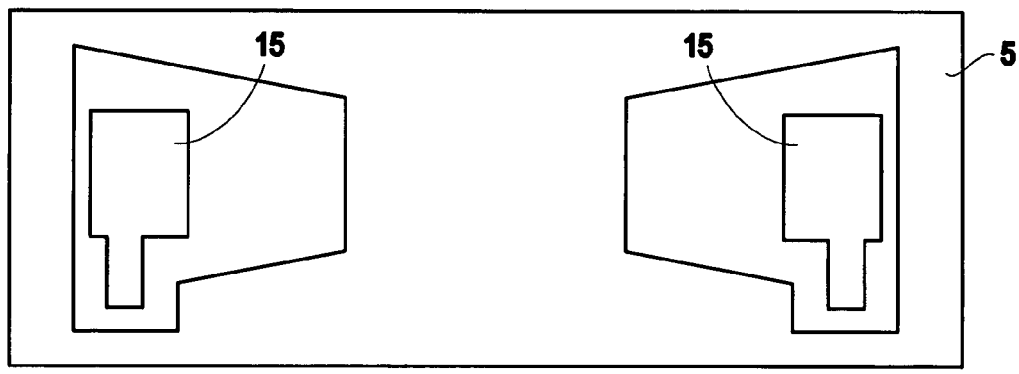
Figure 3C:
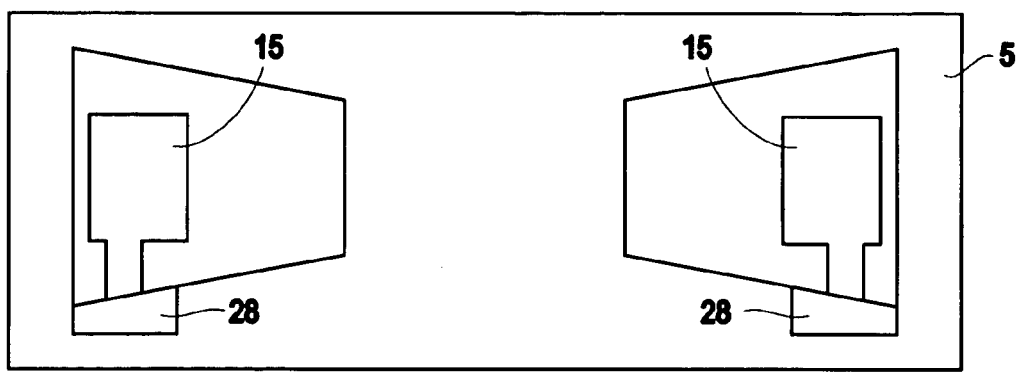
Figure 3D:
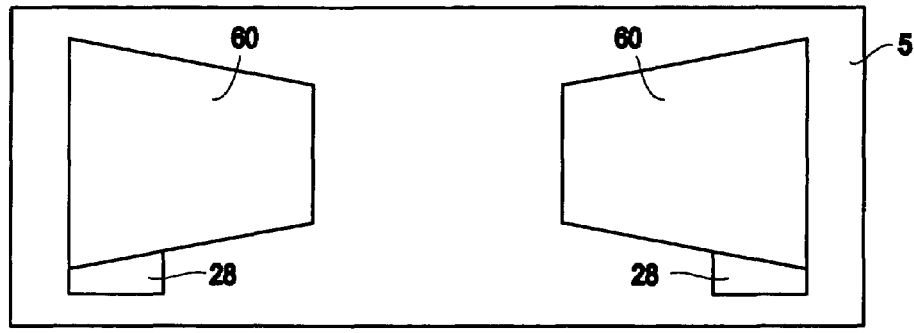
Figure 3E:
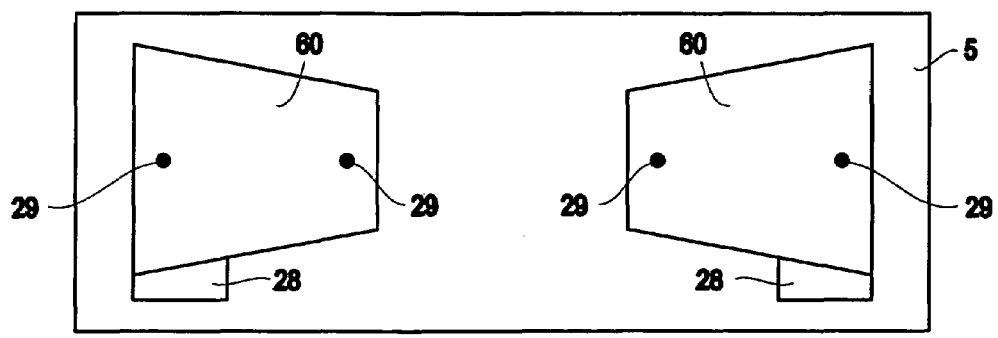
Figure 3F:
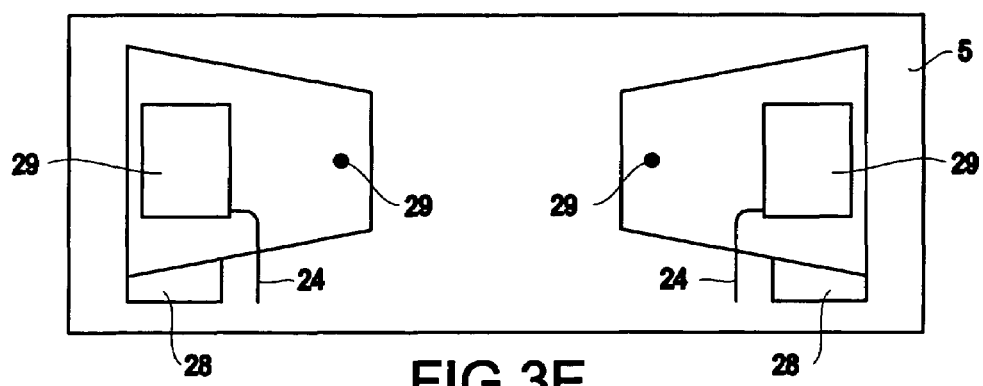
Figure 3G:
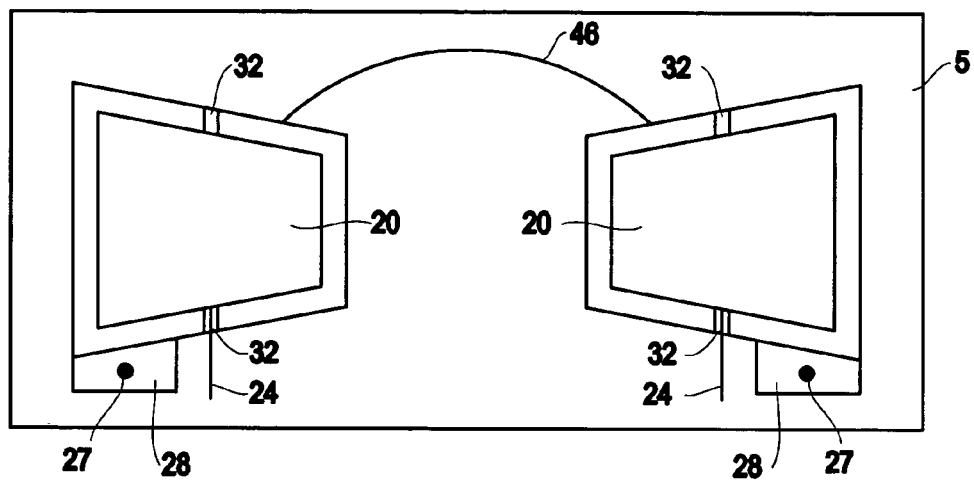

The preferred processing steps are as follows and illustrated in FIGS. 3a–3g:

1. Use lithography to define the edge of the recesses 4 as depicted in FIG. 3a.
2. Etch out these recesses 4.
3. Deposit the bottom electrode pads 15 as depicted in FIG. 3b.
4. Deposit silicon 28 to partially cover bottom electrode pads 15 as depicted in FIG. 3c.
5. Deposit a sacrificial material 60 in the recesses 4 as depicted in FIG. 3d.
6. Deposit silicon bumps 29 and more sacrificial material 60 as shown in FIG. 3e.
7. Deposit the top electrodes 25 and the connections 24 to the top electrode as depicted in FIG. 3f.
8. Deposit silicon flaps 20 and torsional suspension members 32 (and mechanical connectors 46) as depicted in FIG. 3g.
9. Make a via 27 through silicon flaps 28 to provide an electrical connection to the bottom electrode pads 15 as depicted in FIG. 3g.
10. Deposit flux concentrators 40 on top of the silicon flaps. The flux concentrator may be a tri-layer film or more complicated structure as required.
11. Fabricate magnetic sensor 10.
12. Remove the sacrificial material 60.
13. Fabricate mechanical connectors 46 as shown in FIG. 3g.

Polysilicon bumps 29 prevent sticking if top electrodes 25 tend to touch bottom electrode pads 15 or silicon flaps 20 tend to touch the bottom of recesses 4. In operation, the MEMS flux concentrators 40 perform a rotational oscillation. The amplitude of the oscillation is proportional to $QV^2$ where V is the applied voltage and Q is the fraction of energy loss per cycle. In order to minimize the voltage, which must be applied to obtain sufficient oscillation amplitude, it is desirable to have a high Q factor. The major factor, which limits the Q factor, is air resistance. Air resistance may be minimized either by vacuum packaging the device or by putting holes in silicon flaps 20.

Figure 9:
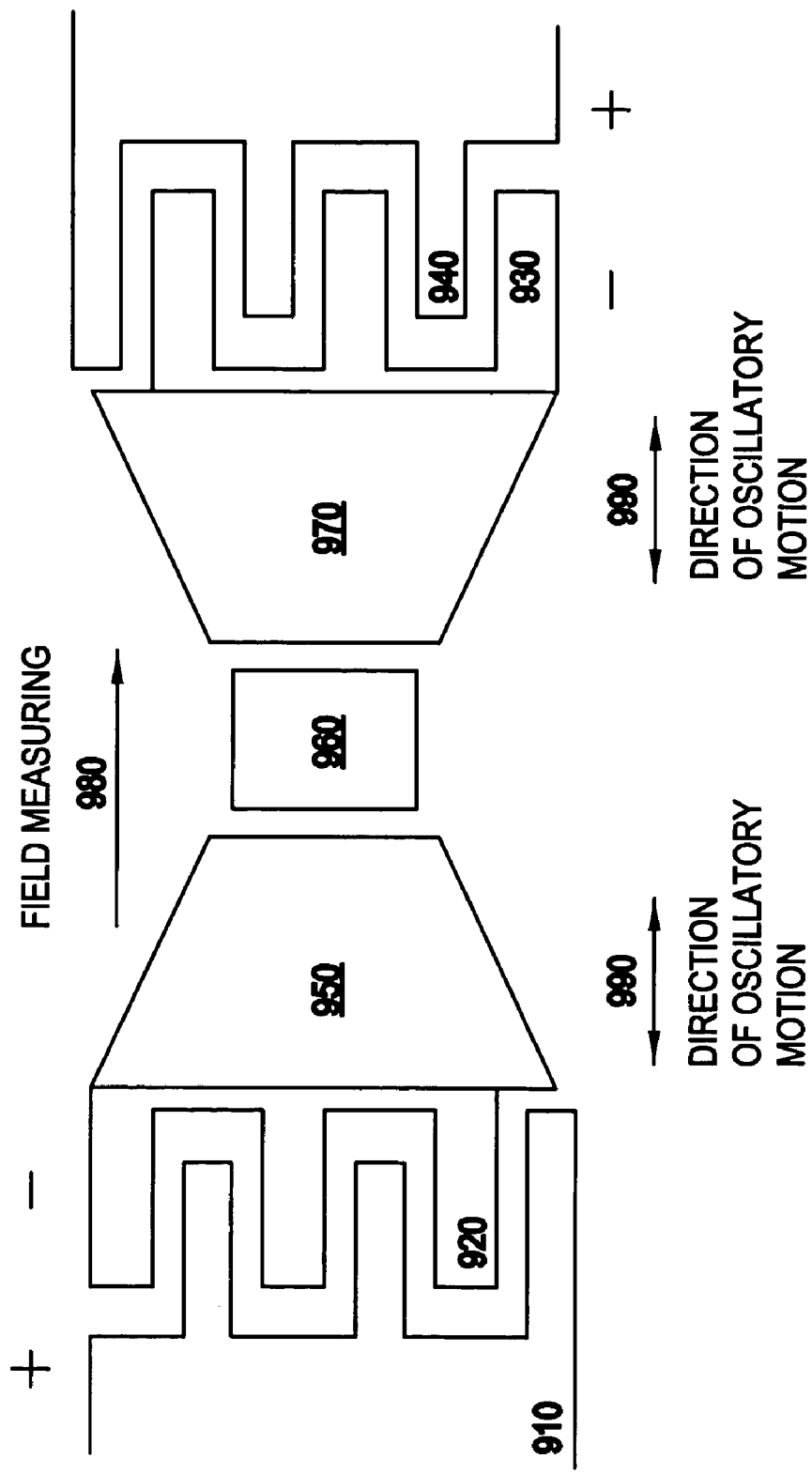
FIG. 9 is an alternate embodiment according to the invention.

FIG. 9 is a schematic drawing of another preferred embodiment of the invention. It differs from the earlier-described embodiment in that the motion is now in the plane of the substrate and the motion is driven by the comb drive, element 930 and 940. As noted above, most magnetic sensors have 1/f noise below 1 Hz, which is one to two orders of magnitude larger than the noise at higher frequencies. This large amount of 1/f noise limits the sensitivity of these sensors when they are used for low frequency applications. Previous inventions which used MEMS flux concentrators to reduce the effect of 1/f noise may not have provided sufficient space (area) for inserting the most useful sensors. The preferred embodiment of the invention solves this problem by providing three times as much space.

The preferred embodiment of the invention improves the performance of all magnetic sensors which suffer from too much 1/f noise. The possible applications for such sensors include unattended ground sensor networks, Anti-Personnel Land Mine Alternatives (APLA), the automotive industry, and detection of counterfeit currency. The preferred embodiment of the invention increases the usefulness of MEMS flux concentrators by providing enough area for using high sensitivity magnetic sensors.

The preferred embodiment of the invention uses a comb drive for a flux concentrator, which provides enough space on the chip for the magnetic sensor. The embodiment of FIG. 9 represents an improvement over the design of FIGS. 1–8 discussed above. For the sake of brevity, components in common with the embodiments of FIGS. 1–8 and the methods of making thereof are not discussed with reference to FIGS. 9–11. Common components and construction techniques may be employed for both embodiments, except where indicated, as will be appreciated by one of ordinary skill in the art.

Referring to FIG. 9, the preferred embodiment of the invention is illustrated which includes a magnetic sensor 960 with two flux concentrators 950, 970 which may oscillate back and forth in opposite (180° out of phase motion) phase in a linear manner as indicated by arrows 990 (direction of oscillatory motion). The field measuring direction 980 is also noted in FIG. 9.

Each flux concentrator 950, 970 increases the sensed magnetic flux density at the position of magnetic sensor 960. A layered material forming part of flux concentrator 950, 970 may comprise a thick film of a soft ferromagnetic material with a large magnetic permeability.

In operation, when flux concentrators 950, 970 are oscillated back and forth, when the flux concentrators are both furthest to magnetic sensor 960 the concentrated magnetic field is decreased at the position of magnetic sensor 960. In that position, there is minimal enhancement of the flux field sensed by the magnetic sensor. When flux concentrators 950, 970 are closest to magnetic sensor 960, the greatest enhancement of magnetic field occurs. Thus, the magnetic field measured by magnetic sensor 960 will oscillate at the frequency of linear oscillation of the magnetic flux concentrators 950, 970.

In a preferred form, magnetic sensor 960 comprises films deposited on a silicon substrate. Flux concentrators 950, 970 may comprise a layer of (e.g., 0.5 micron of permalloy; a roughly 80% Ni and 20% Fe alloy), deposited (e.g., sputtered) onto silicon flaps (not shown) or onto a layer of Si if a SOI (silicon on insulator) wafer is used. The thickness of the insulator should preferably be approximately 1 to 3 microns and the thickness of the Si in the SOI wafer should preferably be approximately 2 to 10 microns. Modulation of a sensed magnetic signal at magnetic sensor 960 may be accomplished by using suspended flux concentrator members 950, 970 which oscillate back and forth, opposite to one another, in the indicated direction 990. The silicon flaps and linear suspension members (not shown) may be formed using microelectromechanical system (MEMS) fabrication techniques.

In the magnetometer, flux concentrators 950, 970 on the silicon flaps are driven electrostatically at a frequency $f_m$ to oscillate at modulating frequency $2f_m$. Modern magnetic sensors may provide enhanced magnetic detection capabilities, but may have increased 1/f noise. For some applications (e.g., military) extremely low frequency signals may need to be detected (e.g., 1 Hz or less). By modulating the magnetic sensor and flux concentrators at a predetermined frequency (e.g., 1 kHz) such low frequency signals may be detected as side bands of such a modulation signal (e.g., ±1 Hz). Raising the measuring frequency in this manner avoids measuring in an area of significant 1/f noise.

The dimensions of flux concentrators 950, 970 in FIG. 9 typically encompass gross dimensions of approximately 100 by 75 microns, while the thickness of the concentrators is typically approximately 0.1 to 15 micrometers. Electrostatic comb drives may be formed to drive magnetic flux concentrators 950, 970 back and forth. Electrostatic comb drives are comprised of comb elements 910, 920 and 930, 940. Such comb drives are known in the art for other MEMS applications, but have not been applied to flux concentrators.

Oscillating and opposing charges may be applied to comb elements 910, 920 and 930, 940 to drive magnetic flux concentrators 950, 970 back and forth. Such a charge may be applied at a frequency $f_m$, which will cause magnetic flux concentrator elements 950, 970 to oscillate at a frequency of $2f_m$. As opposed to the torsional embodiment of FIGS. 1–8, the linear comb drive embodiment of FIGS. 9–11 provides a more linearly progressive movement (as opposed to a radial movement).

Driving the motion from the signal generator requires very little power, particularly if the drive frequency is set at half the mechanical resonant frequency for the 180° out of phase motion of the silicon flaps containing flux concentrators 950, 970. By using the resonant frequency, one obtains the largest amplitudes for the oscillations using the least power. The magnetic field generated by the small currents of the exciting electrostatic modulating signal is negligible.

Comb drives per se are known in the art. See, e.g., Rodgers et al., U.S. Pat. No. 6,133,670, issued Oct. 17, 2000, the complete disclosure of which is herein incorporated by reference. Approximately six variations of the comb drive are investigated. The modulation of the magnetic field at the position of the magnetic sensor 960 can be understood by examining FIG. 10.

Figure 10:
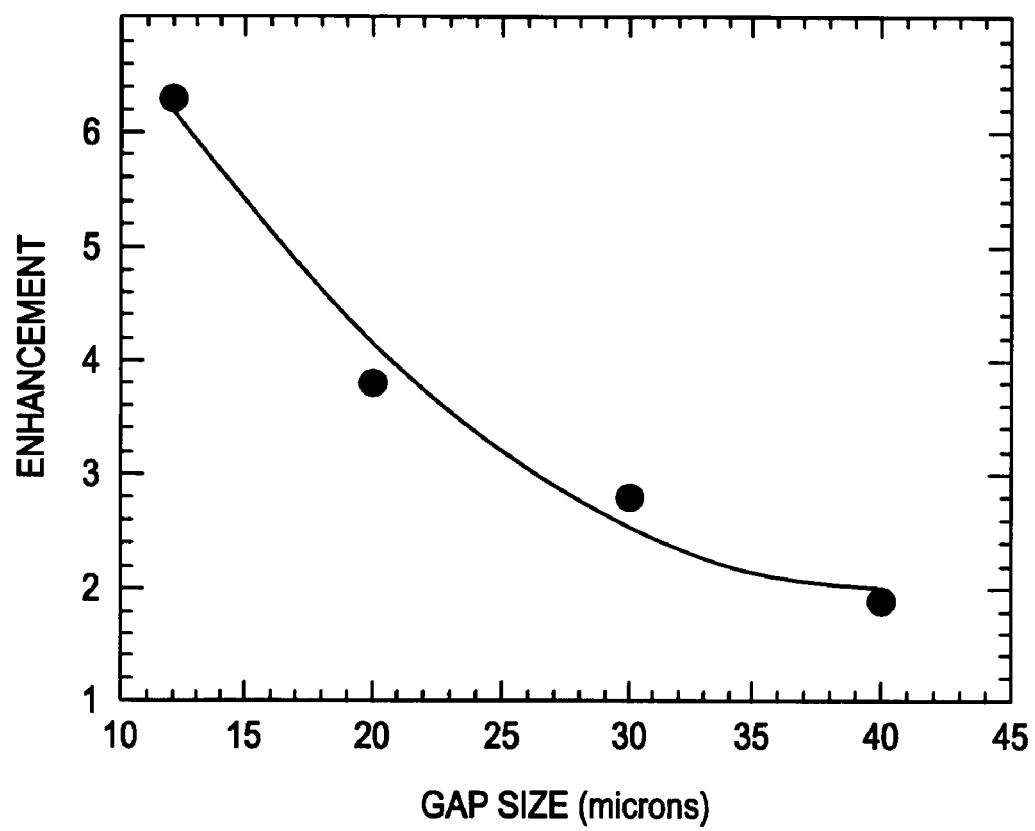
FIG. 10 is a graphical representation illustrating the enhancement of the magnetic field at the position of the sensor as a function of the spacing between the MEMS flux concentrators according to the invention.
Figure 11:
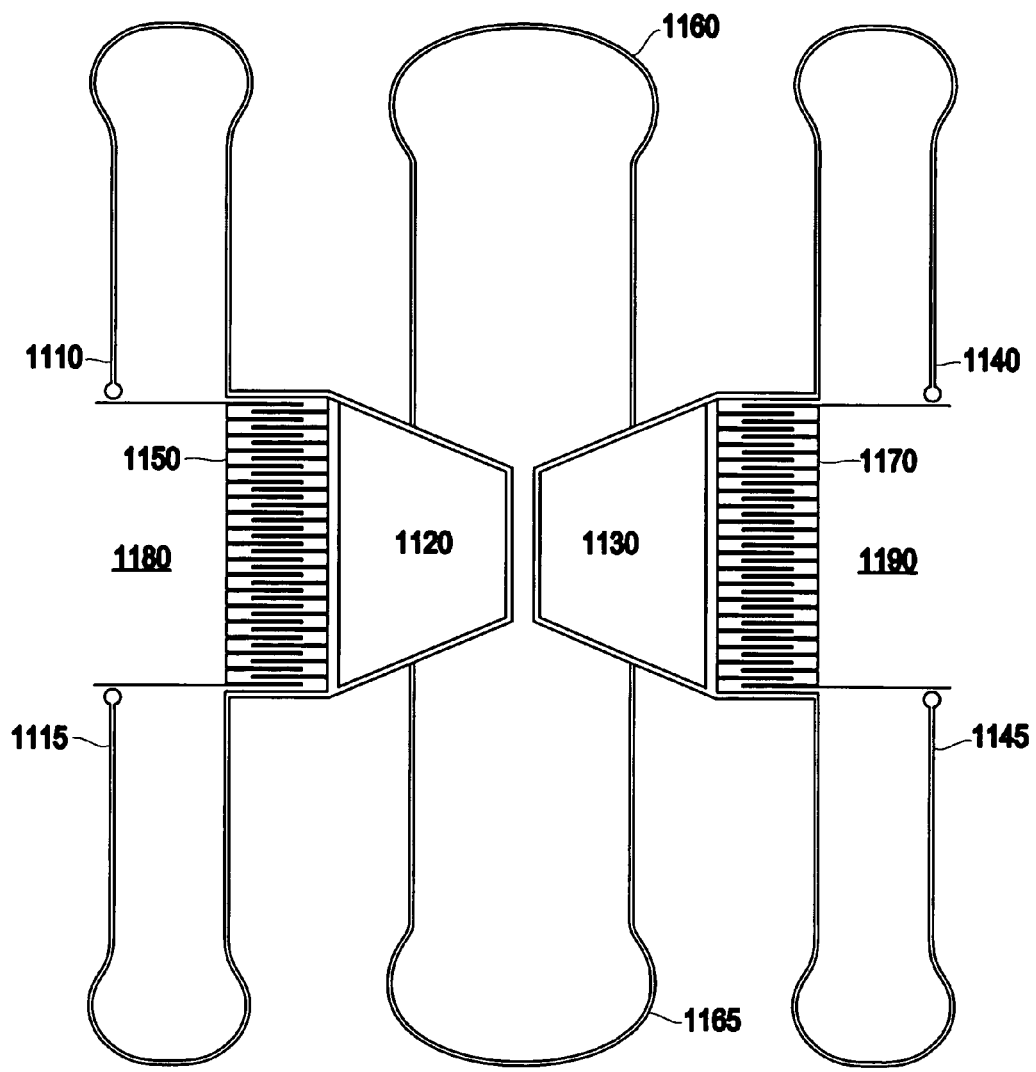
FIG. 11 is a detailed plan view illustrating a layout of the preferred embodiment of the invention.

In the graph of FIG. 10, the vertical axis represents enhancement, a term referring to the ratio of improved magnetic field over the original magnetic field at the position of the magnetic sensor 960. The horizontal axis represents the gap size between the nearest edges of the flux concentrators 950, 970. By modulating the spacing between the flux concentrators from 12 to 30 microns, the enhancement, as determined by magnetic modeling, varies between 6.2 and 2.6. Thus, the modulation will be approximately a factor of 3. This calculation is valid for all six variations of the comb drive.

The force required to achieve this modulation is approximately 3 μN. Applying 50 V will give a force of approximately 1.5 μN. With vacuum packaging, which increases the Q, there should be sufficient force even if the thicknesses of the teeth are decreased from 4 microns to 1 micron. The resonant frequencies are approximately 10 kHz.

FIG. 11 is a more detailed diagram illustrating a layout of the preferred embodiment of the invention. In the diagram of FIG. 11, the magnetic sensor between flux concentrators 1120, 1130 is not shown. FIG. 11 represents a layout diagram, illustrating the physical layout of the flux concentrators 1120, 1130, comb drives 1150, 1170 and suspension springs 1110, 1115, 1140, 1145, 1160, and 1165.

One half of each of comb drives 1150 and 1170 may be fixed to respective fixed portions 1180, 1190 which may represent fixed substrate portions of a semiconductor chip, for example. The magnetic sensor (not shown) may be fixed to the substrate of the semiconductor chip in the area between flux concentrators 1120, 1130. The other interleaved halves of comb drives 1150 and 1170 may be suspended by curved springs 1110, 1115, 1140, and 1145 which may have one end fixed to fixed portions 1180, 1190 as indicated by the circular tabs at the end of each of springs 1110, 1115, 1140, 1145.

Springs 1160, 1165 may connect flux concentrators 1120, 1130 to one another and provide the mechanical system with inherent normal mode resonant frequencies and support flux concentrators 1120 and 1130. As noted above, by driving the system at or near the proper (motion of the flaps 180° out of phase) resonant mechanical frequency, little energy may be required to maintain oscillation of the flux concentrators.

While the preferred embodiment and various alternative embodiments of the invention have been disclosed and described in detail herein, it may be apparent to those skilled in the art that various changes in form and detail may be made therein without departing from the spirit and scope thereof.

For example, while the flux concentrators in the preferred embodiment are illustrated as being provided for linear movement, the invention may also be employed with fixed flux concentrator portions and movable flux concentrator portions and a movable magnetic sensor. In this manner, the mass of the movable portion would be reduced, allowing for higher frequency oscillation.

In addition, the motion of the magnetic flux concentrators may be perpendicular or in some other direction to the sense direction. The actual direction of motion need only be such as to decrease the magnetic field at the position of the sensor, which is one underlying idea of the invention.

Moreover, the size of the flux concentrators relative to the sensor as illustrated in the accompanying figures should not be construed as limiting the invention. The size of the flux concentrators of the invention may be suitably altered (larger or smaller) to achieve different sensitivities and other effects, or depending upon the type of material or magnetic sensor used. Some magnetic sensors require more space than others and the design can be modified to accommodate this requirement. The invention provides several benefits. For example, the invention alleviates the problem of 1/f noise in the magnetic sensor. By varying the average enhancement of the field one can change the sensitivity and/or avoid overloading the sensor. The various designs for the microstructure of the magnetic materials in the flux concentrator provide considerable design flexibility. By choosing the optimum design one should also mitigate the problem of noise in the flux concentrator. As stated earlier, the device eliminates the problem of the DC offset.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A microelectromechanical system (MEMS) device comprising:
   a base structure;
   a magnetic sensor attached to said base structure and operable for sensing a magnetic field and allowing for a continuous variation of an amplification of the magnetic field at a position at said magnetic sensor; and for receiving a DC voltage and an AC modulation voltage in said MEMS device;
   a pair of flux concentrators attached to said magnetic sensor;
   a pair of electrostatic comb drives, each coupled to a respective flux concentrator such that a first half of each comb drive is attached to the base structure opposite from a corresponding second half of each comb drive that is attached to the flux concentrator such that when the pair of electrostatic comb drives are excited by a modulating electrical signal, each flux concentrator oscillates linearly at a prescribed frequency;
   a pair of bias members connecting said flux concentrators to one another;
   wherein said DC voltage increases a spacing between said flux concentrators; and
   wherein said flux concentrators are modulated to increase an operating frequency to eliminate 1/f-type noise, where f is a frequency of operation of said magnetic sensor.

2. The MEMS device of claim 1, wherein the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

3. The MEMS device of claim 1, wherein said AC modulation voltage shifts said operating frequency of said magnetic sensor.

4. The MEMS device of claim 1, wherein each flux concentrator comprises a layer of a hard magnetic material, a spacer layer, and a layer of a soft magnetic material.

5. The MEMS device of claim 4, wherein the layer of soft magnetic material comprises single domain magnetic particles and a nonmagnetic material.

6. The MEMS device of claim 5, wherein a volume fraction of single domain magnetic particles to nonmagnetic material is less than or equal to approximately fifty percent.

7. The MEMS device of claim 4, wherein a coercivity of the hard magnetic material is greater than approximately 50 Oersteds and a coercivity of the soft magnetic material is less than approximately 3 Oersteds.

8. The MEMS device of claim 1, wherein said pair of bias members is operable to correlate the motion of the flux concentrators.

9. The MEMS device of claim 8, wherein said pair of bias members comprises a pair of spaced apart springs interconnecting said flux concentrators.

10. A low-frequency microelectromechanical modulating magnetic field transducer comprising:
    a base structure;
    a magnetic sensor attached to the base structure and operable for receiving a DC voltage and an AC modulation voltage in said MEMS device;
    a flap on either side of said magnetic sensor, each flap including a flux concentrator;
    a pair of electrostatic comb drives, each coupled to a respective flux concentrator such that a first half of each comb drive is attached to the base structure opposite from a corresponding second half of each comb drive that is attached to the flux concentrator such that when the pair of electrostatic comb drives are excited by a modulating electrical signal, each flux concentrator oscillates linearly at a prescribed frequency thereby minimizing 1/f-type noise, where f is a frequency of operation of said magnetic sensor;
    at least one mechanical spring connector connecting said flaps to one another;
    wherein said DC voltage increases a spacing between said flux concentrators;
    wherein said flux concentrators are modulated to increase an operating frequency to eliminate 1/f-type noise; and
    wherein said AC modulation voltage increases said operating frequency of said magnetic sensor.

11. The transducer of claim 10, wherein the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

12. The transducer of claim 10, wherein each flux concentrator comprises a layer of a hard magnetic material, a spacer layer, and a layer of a soft magnetic material.

13. The transducer of claim 12, wherein the layer of soft magnetic material comprises single domain magnetic particles and a nonmagnetic material.

14. The transducer of claim 13, wherein a volume fraction of single domain magnetic particles to nonmagnetic material is less than or equal to approximately fifty percent.

15. The transducer of claim 12, wherein a coercivity of the hard magnetic material is greater than approximately 50 Oersteds and a coercivity of the soft magnetic material is less than approximately 3 Oersteds.

16. A microelectromechanical system (MEMS) device comprising:
    a magnetic sensor operable to receive a DC voltage and an AC modulation voltage;
    a plurality of flux concentrators attached to said magnetic sensor, wherein said flux concentrators are modulated to increase an operating frequency to eliminate 1/f-type noise in said MEMS device;
    a pair of springs connecting said flux concentrators to one another;
    wherein said DC voltage increases a spacing between said flux concentrators; and
    wherein said AC modulation voltage shifts said operating frequency of said magnetic sensor.

17. The MEMS device of claim 16, further comprising a base structure attached to said magnetic sensor and a pair of electrostatic comb drives, each coupled to a respective flux concentrator such that a first half of each comb drive is attached to the base structure opposite from a corresponding second half of each comb drive that is attached to the flux concentrator such that when the pair of electrostatic comb drives are excited by a modulating electrical signal, each flux concentrator oscillates linearly at a prescribed frequency.

18. The MEMS device of claim 16, wherein the magnetic sensor comprises one of a Hall effect type sensor, a magnetoresistive sensor, a MEMS sensor, a magneto-diode, a magneto-transistor, a MAGFET, a fluxgate, a miniature fluxgate magnetometer, a SQUID and a magneto-optical sensor.

19. The MEMS device of claim 16, wherein each flux concentrator comprises a layer of a hard magnetic material, a spacer layer, and a layer of a soft magnetic material.

20. The MEMS device of claim 19, wherein the layer of soft magnetic material comprises single domain magnetic particles and a nonmagnetic material.

21. The MEMS device of claim 20, wherein a volume fraction of single domain magnetic particles to nonmagnetic material is less than or equal to approximately fifty percent.

22. The MEMS device of claim 19, wherein a coercivity of the hard magnetic material is greater than approximately 50 Oersteds and a coercivity of the soft magnetic material is less than approximately 3 Oersteds.

* * * * *